(12) United States Patent
Goda et al.

(10) Patent No.: US 10,666,166 B2
(45) Date of Patent: May 26, 2020

(54) SEMICONDUCTOR DEVICE

(71) Applicants: DENSO CORPORATION, Kariya, Aichi-pref. (JP); University of Freiburg, Freiburg (DE)

(72) Inventors: Kenta Goda, Kariya (JP); Oliver Paul, Au (DE)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/263,227

(22) Filed: Jan. 31, 2019

(65) Prior Publication Data

US 2019/0165695 A1 May 30, 2019

Related U.S. Application Data (63) Continuation of application No. PCT/JP2017/030095, filed on Aug. 23, 2017.

(30) Foreign Application Priority Data

Aug. 24, 2016 (JP) ................................. 2016-164006

(51) Int. Cl.
| | |
|---|---|
| H02N 1/08 | (2006.01) |
| B81B 3/00 | (2006.01) |
| H01G 7/02 | (2006.01) |
| H01G 7/06 | (2006.01) |
| H04R 19/00 | (2006.01) |
| H04R 19/01 | (2006.01) |

(52) U.S. Cl.
CPC ................. *H02N 1/08* (2013.01); *B81B 3/00* (2013.01); *H01G 7/02* (2013.01); *H01G 7/06* (2013.01); *H04R 19/005* (2013.01); *H04R 19/01* (2013.01); *H04R 2499/13* (2013.01)

(58) Field of Classification Search
CPC .. H02N 1/08; H02N 1/06; H01G 7/02; H01G 7/06; B81B 3/00; H04R 19/01; H04R 2499/13; H04R 19/005
USPC .................................................. 310/300, 309
See application file for complete search history.

(56) References Cited

U.S. PATENT DOCUMENTS

| | | | | |
|---|---|---|---|---|
| 7,649,302 B2* | 1/2010 | Murayama | ............. | H02N 1/004 310/309 |
| 8,288,917 B2* | 10/2012 | Nakatsuka | ............. | H02N 1/006 307/400 |

(Continued)

FOREIGN PATENT DOCUMENTS

| | | | |
|---|---|---|---|
| JP | 2010011547 | * | 1/2010 |
| JP | 2011036089 | * | 2/2011 |
| JP | 2017-028868 A | | 2/2017 |

OTHER PUBLICATIONS

Takumi Tsutsumino et al.,"Nano-Metal-Ink-Based Electrode Embedded in Parylene HARS with the Aid of the Capillary Effect," pp. 313-316; MEMS 2007, Jan. 2007.

*Primary Examiner* — Alfonso Perez Borroto
*Assistant Examiner* — Ahmed Elnakib
(74) *Attorney, Agent, or Firm* — Posz Law Group, PLC (57) ABSTRACT

The present disclosure provides a semiconductor device including a fixed electrode, a movable electrode and an elastic support. The movable electrode faces the fixed electrode and is movable relative to the fixed electrode. The elastic support supports the movable electrode to be movable in an elastic direction of the elastic support. Either one of the fixed electrode or the movable electrode is an electret electrode.

8 Claims, 5 Drawing Sheets

(56) References Cited

U.S. PATENT DOCUMENTS

| | | | | |
|---|---|---|---|---|
| 8,466,600 B2* | 6/2013 | Naruse | .................... | H02N 1/006 |
| | | | | 310/309 |
| 8,710,712 B2* | 4/2014 | Nakatsuka | ............... | H02N 1/10 |
| | | | | 310/300 |
| 8,716,916 B2* | 5/2014 | Nakatsuka | ............. | H02N 1/004 |
| | | | | 310/308 |
| 8,796,902 B2* | 8/2014 | Masaki | .................... | H02N 1/08 |
| | | | | 310/309 |
| 8,933,611 B2* | 1/2015 | Nakatsuka | ............... | H02N 1/08 |
| | | | | 290/1 R |
| 9,134,168 B2* | 9/2015 | Masaki | .................. | G01H 11/06 |
| 9,190,936 B2* | 11/2015 | Naito | ..................... | H02N 1/08 |
| 2008/0048521 A1* | 2/2008 | Mabuchi | ............... | B60C 23/041 |
| | | | | 310/309 |
| 2008/0111444 A1* | 5/2008 | Mabuchi | ............... | H02N 1/006 |
| | | | | 310/309 |
| 2008/0122313 A1* | 5/2008 | Mabuchi | ............... | H02N 1/004 |
| | | | | 310/309 |
| 2009/0085530 A1* | 4/2009 | Matsubara | ................ | F03G 7/08 |
| | | | | 320/166 |
| 2010/0072855 A1* | 3/2010 | Matsubara | ............... | H02N 1/08 |
| | | | | 310/300 |
| 2011/0109195 A1* | 5/2011 | Nakatsuka | ............... | H02N 1/08 |
| | | | | 310/300 |
| 2013/0076202 A1* | 3/2013 | Naito | ....................... | H02N 1/08 |
| | | | | 310/300 |
| 2013/0099626 A1* | 4/2013 | Takeuchi | ................. | H02N 1/08 |
| | | | | 310/300 |
| 2014/0327337 A1* | 11/2014 | Masaki | ................. | G01H 11/06 |
| | | | | 310/300 |
| 2014/0339954 A1 | 11/2014 | Yamakawa et al. | | |
| 2019/0165695 A1* | 5/2019 | Goda | ........................ | B81B 3/00 |

* cited by examiner

SEMICONDUCTOR DEVICE

CROSS REFERENCE TO RELATED APPLICATIONS

The present application is a continuation application of International Patent Application No. PCT/JP2017/030095 filed on Aug. 23, 2017, which designated the U.S. and claims the benefit of priority from Japanese Patent Application No. 2016-164006 filed on Aug. 24, 2016. The entire disclosures of all of the above applications are incorporated herein by reference.

TECHNICAL FIELD

The present disclosure relates to a semiconductor device that converts vibration energy into electric power.

BACKGROUND

Electret is a substance retaining permanent electric polarization. When using the electret in a power generation device, burden on the environment may be reduced. In the power generation device using the electret, electric charges are induced in an opposing electrode opposing the electret by an electrostatic field formed by the electret. By changing an overlapping area of the electret and the opposing electrode, an alternating current is generated in an external circuit connected to the electrode.

SUMMARY

The present disclosure provides a semiconductor device including a fixed electrode, a movable electrode and an elastic support. The movable electrode faces the fixed electrode and is movable relative to the fixed electrode. The elastic support supports the movable electrode to be movable in an elastic direction of the elastic support. Either one of the fixed electrode and the movable electrode is an electret electrode.

BRIEF DESCRIPTION OF THE DRAWINGS

The above and other objects, features and advantages of the present disclosure will become more apparent from the following detailed description made with reference to the accompanying drawings in which.

DETAILED DESCRIPTION

A semiconductor device may include a stopper limiting excessive movement of a movable electrode by vibrations, the movable electrode being relatively movable with respect to a fixed electret. The stopper contacts a movable body including the movable electrode to limit the movement of the movable body. When the contact between the stopper and the movable body is repeated, damage due to the collision accumulates on the stopper and the movable body. This damage may cause reduction in reliability of the semiconductor device.

Embodiments of the present disclosure will be hereinafter described with reference to the drawings. Parts identical or equivalent to each other among various drawings are given the same reference numerals.

First Embodiment

First, a schematic configuration of a semiconductor device according to the present embodiment will be described with reference to FIG. 1 and FIG. 2. Although FIG. 1 is a top view, elements are hatched for ease of recognition.

The semiconductor device is, for example, a device converting energy of vibration generated on a daily basis into electric power. The semiconductor device is mounted on a vehicle, for example, and uses electric power generated by vibration of a vehicle as a power source of an in-vehicle sensor. As such, the in-vehicle sensor can be driven without harness and without being connected to an external power source such as a battery.

Figure 1:
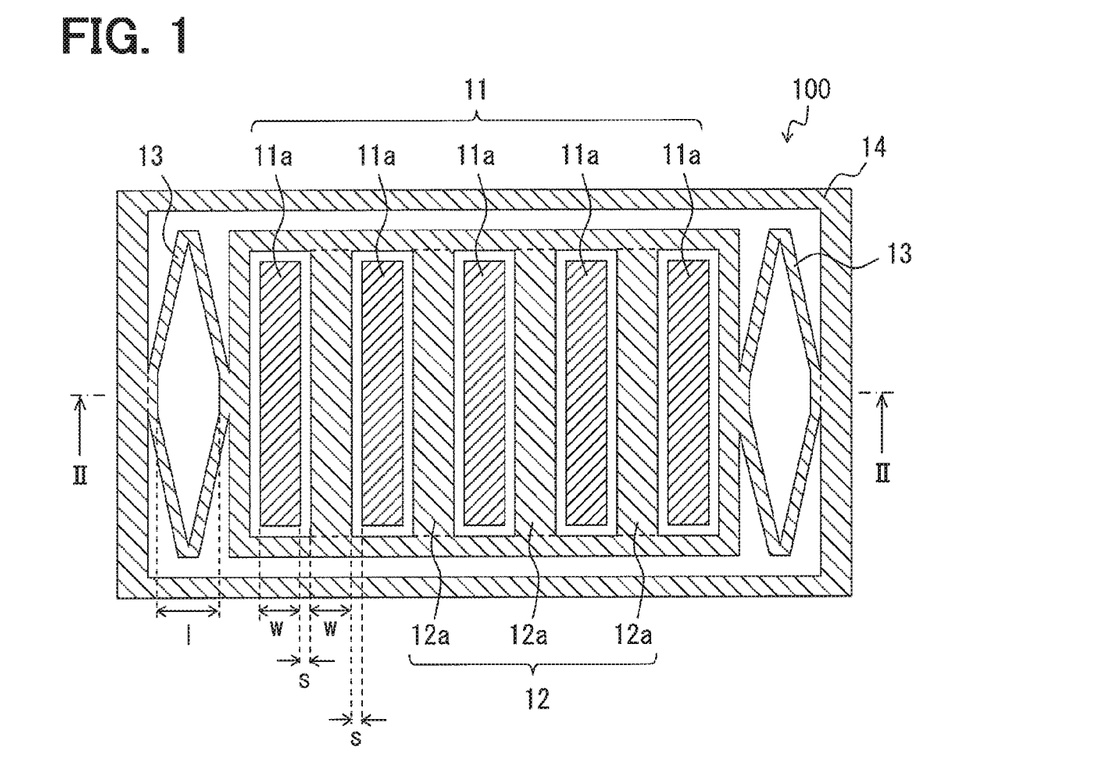
FIG. 1 is a top view showing a structure of a movable electrode and a fixed electrode in a first embodiment.
Figure 2:
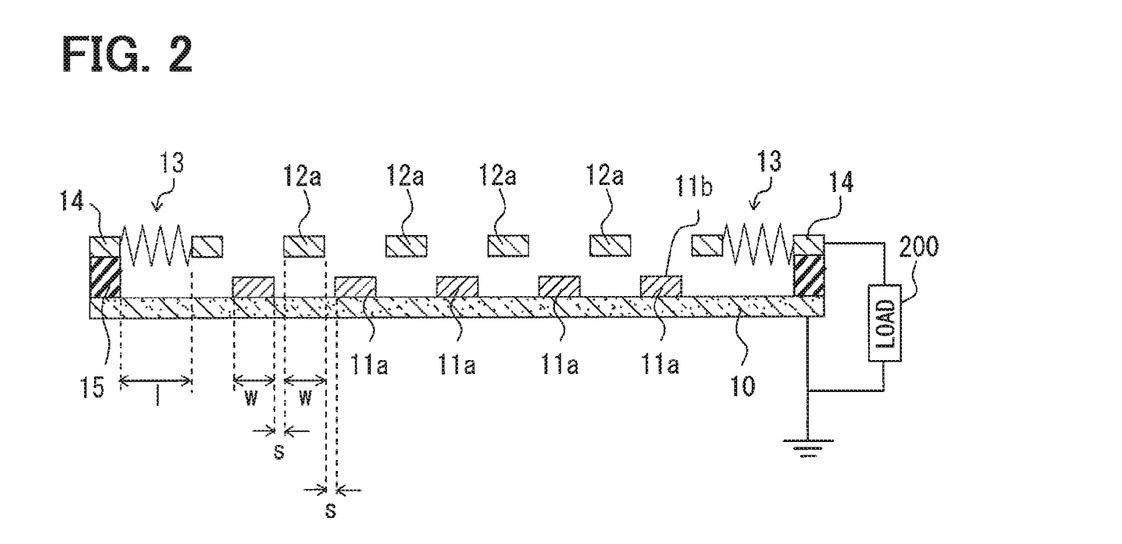
FIG. 2 is a cross-sectional view taken along the line II-II in FIG. 1 and showing the structure of the movable electrode and the fixed electrode.

As shown in FIGS. 1 and 2, the semiconductor device 100 includes a conductive substrate 10, a fixed electrode 11, a movable electrode 12, a string structure 13 and a frame portion 14. The fixed electrode 11 is fixed on the conductive substrate 10. The movable electrode 12 is disposed at a position facing a main surface 11b of the fixed electrode 11. The spring structure 13 is attached to the movable electrode 12 and supporting the movable electrode 12. The frame portion 14 surrounds and protects the movable electrode 12 and the fixed electrode 11. The movable electrode 12 is supported by the frame portion 14 via the spring structure 13. The movable electrode 12 is movable relative to the frame portion 14 and the fixed electrode 11 by expansion and contraction of the spring structure 13.

The conductive substrate 10 is, for example, a substrate containing silicon as a main component. As shown in FIG. 2, the fixed electrode 11 includes a plurality of electrodes 11a and the electrodes 11a are fixed to one surface of the conductive substrate 10. The conductive substrate 10 is connected to a reference potential (for example, ground potential) and supplies a reference potential to the connected load 200. Further, the frame portion 14 (described later) is fixed to the conductive substrate 10 via an insulation film 15. That is, the conductive substrate 10 also has a function of supporting the frame portion 14 and the movable electrode 12.

As shown in FIG. 1 and FIG. 2, the fixed electrode 11 includes a plurality of electrodes 11a formed on the conductive substrate 10 in a stripe shape. The electrodes 11a may be referred to as electrode parts 11a. The electrode 11a in the present embodiment is made of electret and is in a charged state by a method such as corona discharge, electron beam irradiation, X-ray charging, or the like. As the electric charge is held in the electrode 11a, an electrostatic field is generated around the electrode 11a included in the fixed electrode 11. As such, induced charges are generated in the opposing movable electrode 12 and the conductive substrate 10.

Each of the electrodes 11a included in the fixed electrode 11 is a rectangular parallelepiped having a longitudinal direction in one direction. The electrodes 11a extend in a stripe shape and are arranged in a lateral direction at a predetermined interval. In other words, the fixed electrode 11 has a structure in which the electrodes 11a are periodically arranged in the lateral direction. A length of the electrode 11a in the lateral direction (hereinafter referred to as width) is expressed as w.

The movable electrode 12 is an electrode arranged to face the main surface 11b of the fixed electrode 11. The movable electrode 12 includes a plurality of electrodes 12a formed in a stripe shape. The electrodes 12a may be referred to as electrode parts 12a. The movable electrode 12 is made mainly of, for example, silicon. Similarly to the electrode 11a included in the fixed electrode 11, each of the electrodes 12a included in the movable electrode 12 is a rectangular parallelepiped having a longitudinal direction in one direction. The electrodes 12a extend in a stripe shape and are arranged in a lateral direction at a predetermined interval.

In other words, the movable electrode 12 has a structure in which the electrodes 12a are periodically arranged in the lateral direction. The longitudinal direction of the electrode 12a accords with the longitudinal direction of the electrode 11a. As shown in FIG. 1, the electrode 12a and the electrode 11a can be in a staggered state. When the movable electrode 12 moves in the lateral direction of the electrode 12a, the electrode 12a and the electrode 11a can also be in an overlapping state.

As shown in FIG. 1, the electrodes 12a included in the movable electrode 12 are connected to each other at the end portions in the longitudinal direction, and are formed as an integral movable electrode 12 as a whole. In other words, in a front view of the main surface 11b of the fixed electrode 11, the movable electrode 12 is bored in a ladder shape so that the fixed electrode 11 is in a visible state. That is, the movable electrode 12 has a form like a so-called insect basket window.

The width of the electrode 12a in the present embodiment is the same as the width w of the electrode 11a included in the fixed electrode 11. In a state where the electrode 12a is located just in the center of the adjacent electrodes 11a as shown in FIG. 1 or FIG. 2, a separation distance between the electrode 11a and the electrode 12a in the lateral direction is expressed as s. That is, a formation period of the electrode 11a included in the fixed electrode 11 in the lateral direction is expressed as 2w+2s. In addition, the formation period of the electrode 12a included in the movable electrode 21 in the lateral direction is also expressed as 2w+2s.

The movable electrode 12 is movable in the lateral direction of the electrode 12a and relatively moves with respect to the fixed electrode 11. Therefore, as shown in FIG. 1 and FIG. 2, there are a state in which the electrode 11a and the electrode 12a do not overlap, and a state in which the electrode 11a and the electrode 12a overlap. In a state in which the electrode 11a is completely hidden by the electrode 12a in the front view of the main surface 11b, a capacitance between the fixed electrode 11 and the movable electrode 12 is the maximum (Cmax). In this state, the electrostatic field generated by the electret induces the maximum electric charge to the movable electrode 12.

On the other hand, as shown in FIG. 1 and FIG. 2, in a state in which the electrode 12a is located just in the center of the adjacent electrodes 11a, the electrode 11a and the electrode 12a are maximally separated in the front view of the main surface 11b. In this state, the capacitance between the fixed electrode 11 and the movable electrode 12 is the minimum (Cmin).

The spring structure 13 corresponds to an elastic support. The string structure 13 is capable of expanding and contracting in the lateral direction of the electrode 12a, thereby to movably support the movable electrode 12. One spring structure 13 is formed at each end of the electrode 12a included in the movable electrode 12 in the lateral direction, that is, at both end portions in the arrangement direction of the electrodes 12a. As a result, two spring structures 13 support the movable electrode 12. The spring structure 13 mediates the frame portion 14 and the movable electrode 12. That is, the movable electrode 12 is supported by the frame portion 14 via the spring structure 13.

As described above, the frame portion 14 is fixed to the conductive substrate 10 via the insulation film 15. Therefore, the movable electrode 12 is movable relative to the conductive substrate 10, the fixed electrode 11 and the frame portion 14.

Any elastic structure may be adopted as long as the spring structure 13 expands and contracts in the lateral direction of the electrode 12a. In this embodiment, for example, the string structure 13 has a folded spring method or a double folded spring method as a spring structure. As shown in FIG. 1, the spring structure 13 causes elasticity by boring the center of a diamond-shaped silicon plate so as to leave an outer frame. The spring structure 13 is interposed between the frame portion 14 and the movable electrode 12 in the direction of expansion and contraction thereof (referred to as an elastic direction). When no external force is applied to the semiconductor device 100 and the movable electrode 12 rests (i.e., the movable electrode 12 is stationary), the width of the spring structure 13 in the elastic direction is expressed as l.

In this embodiment, each of the movable electrode 12, the spring structure 13 and the frame portion 14 is a conductor containing silicon as a main component. The movable electrode 12, the spring string structure 13 and the frame portion 14 are integrally formed. Specifically, by patterning a single silicon plate, the ladder-like movable electrode 12, the spring structure 13, and the frame portion 14 surrounding them are formed in the same process.

As shown in FIG. 2, the external load 200 is connected between the above-described conductive substrate 10 and the frame portion 14. Since the frame portion 14 is electrically connected to the movable electrode 12 via the spring structure 13, the load 200 is substantially connected between the movable electrode 12 and the conductive substrate 10. When external vibration is applied to the movable electrode 12, the movable electrode 12 vibrates in the elastic direction of the spring structure 13, and electric charges are induced by the electrostatic field generated by the electret. The electric charges induced in the movable electrode 12 flows through the load 200.

In the present embodiment, as described above, when no external force is applied to the semiconductor device 100 and the movable electrode 12 rests, the width of the spring structure 13 in the elastic direction is l, and the electrode 12a is located just in the center of the adjacent electrodes 11a. That is, when the movable electrode 12 rests, the movable electrode 12 and the fixed electrode 11 do not overlap. The width l of the spring structure 13 in the elastic direction is substantially equal to the displacement amount (in other words, movable distance) of the movable electrode 12 when the spring structure 13 is maximally compressed.

Furthermore, in the semiconductor device 100 according to the present embodiment, the formation period (i.e., 2w+2s) of the electrodes 11a included in the fixed electrode 11 or the electrodes 12a included in the movable electrode 12 is less than twice the width l in the elastic direction of the spring structure 13 (i.e., 2l). That is, a relation w+s<l is satisfied.

Next, the movement of the movable electrode 12 will be described with reference to FIGS. 3 to 5.

First, the electrostatic capacitance between the fixed electrode 11 and the movable electrode 12 will be described.

Figure 3:
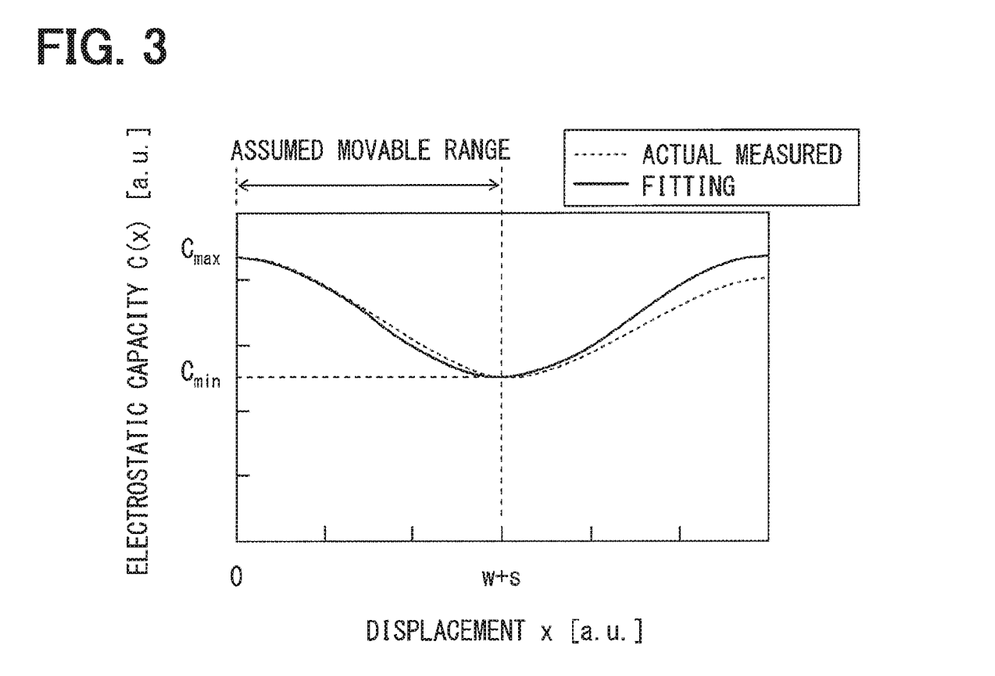
FIG. 3 is a diagram showing a relationship between a displacement of the movable electrode and an electrostatic capacity.

The electrostatic capacity C(x) varies as shown in FIG. 3 when the elastic direction of the spring structure 13 is applied to the x direction. The horizontal axis shown in FIG. 3 represents the displacement distance of the movable electrode 12. A state in which the electrode 11a and the electrode 12a completely overlap with each other is applied to x=0. The vertical axis represents the electrostatic capacitance C(x).

As shown in FIG. 3, the electrostatic capacity has a maximum value Cmax at x=0. On the other hand, as shown in FIGS. 1 and 2, the electrostatic capacity has a minimum value Cmin in a state (x=w+s) in which the electrode 12a is located just in the center of the adjacent electrodes 11a. The actual measured value of capacitance can be approximated by a trigonometric function from the formation periodicity of the electrode 11a and the electrode 12a. In particular, the approximation accuracy is high within the range of 0≤x≤w+s which is assumed as the movable range of the movable electrode 12a. That is, the electrostatic capacity can be approximated as Equation 1.

$$C(x) = \frac{C_{max} + C_{min}}{2} + \frac{C_{max} - C_{min}}{2}\cos\left(\frac{\pi}{w+s}x + \phi\right) \quad \text{[Equation 1]}$$

In Equation 1, Φ is a constant related to a phase difference. In the present embodiment, when the movable electrode 12 rests, the electrode 12a is located just in the center of the adjacent electrodes 11a, so Φ=0. In the following explanation, with respect to the definition of the displacement x, the state where the electrode 12a is located just in the center of the adjacent electrodes 11a is applied to x=0, and the state in which the electrode 11a and the electrode 12a completely overlap with each other is applied to x=w+s.

Figure 4:
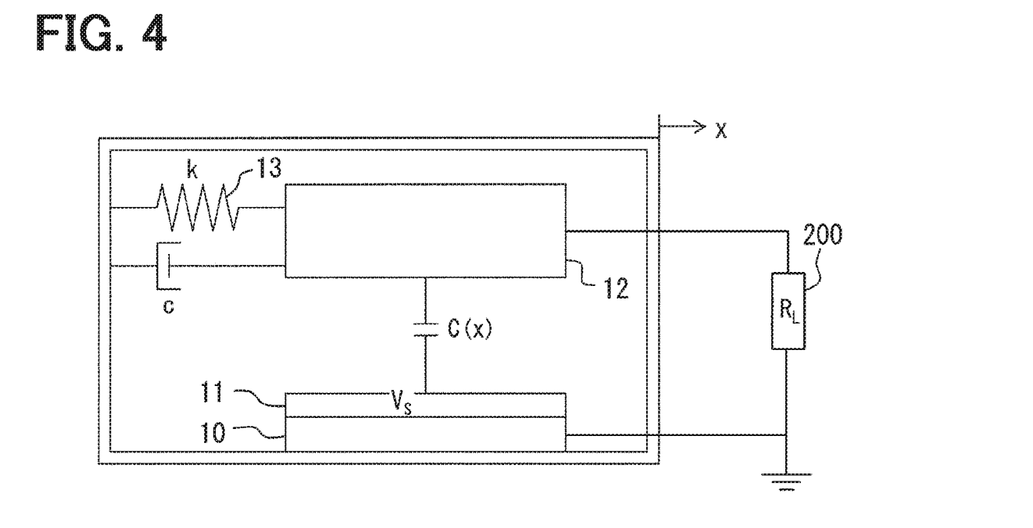
FIG. 4 is a diagram showing a motion model of the movable electrode.

The movement of the semiconductor device 100 according to the present embodiment can be considered as a model shown in FIG. 4. In the model, the fixed electrode 11, which is made of electret, and the movable electrode 12 are simplified to a configuration without patterning, and a spring having a spring constant k and corresponding to the spring structure 13 is provided. The fixed electrode 11 holds charges caused by the electret, and has a surface potential of Vs. A load 200 having a resistance value $R_L$ is connected between the conductive substrate 10 and the movable electrode 12. An electrostatic capacitance C(x) is generated between the movable electrode 12 and the fixed electrode 11.

The elastic direction of the spring is applied to x direction, and the movable electrode 12 vibrates in the x direction upon receiving an external force. In addition, when the movable electrode 12 moves, the vibration of the movable electrode 12 is attenuated by air resistance and resistance related to the expansion and contraction of the spring structure 13. An attenuation constant relating to these attenuations is defined as c.

Figure 5:
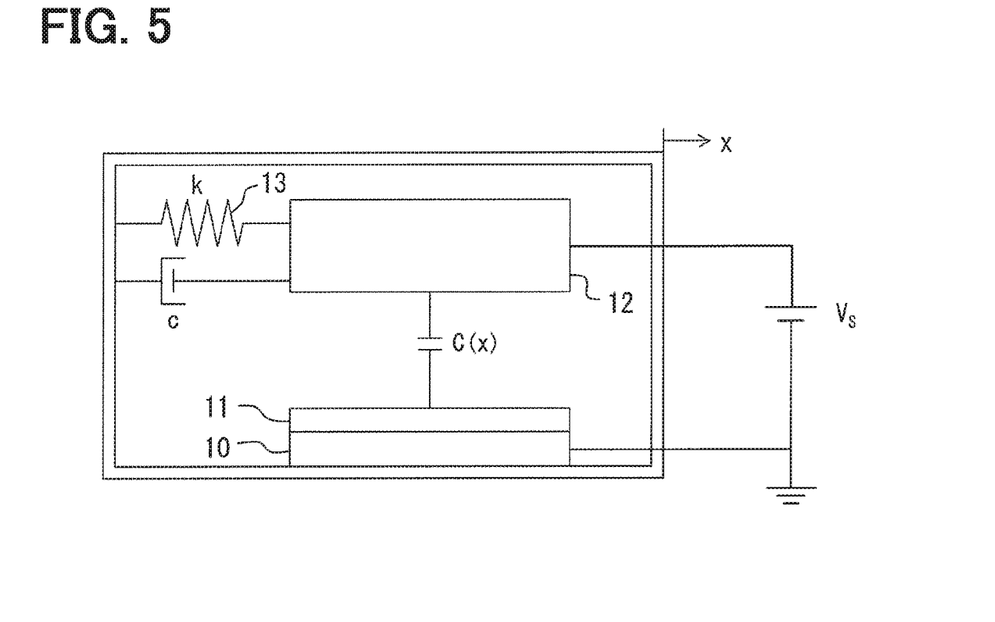
FIG. 5 is a simplified diagram of the motion model of the movable electrode.

FIG. 5 shows a simplified model of the model shown in FIG. 4. That is, the surface potential and the resistance value of the load 200 are set to zero. Then, instead of the load 200, a power source is provided to generate a potential difference Vs between the fixed electrode 11 and the movable electrode 12.

In the model shown in FIG. 5, the movement equation of the movable electrode 12 with respect to an external force f is given by Equation 2. Note that a mass of the movable electrode 12 is expressed by m.

$$f = m\frac{d\dot{x}}{dt} + c\dot{x} + kx - \frac{1}{2}\frac{dC(x)}{dx}V_s^2 \quad \text{[Equation 2]}$$

In Equation 2, the first term on the right side is the inertia term of the movable electrode 12. The second term is an attenuation term defined by the attenuation constant c, and is proportional to the velocity of the movable electrode 12. The third term is an elastic term by the spring structure 13. The fourth term is an electrostatic term caused by an electrostatic field generated between the movable electrode 12 and the fixed electrode 11.

When Equation 1 is substituted into Equation 2, and Φ=π and A=(Cmax−Cmin)×π/2 (w+s) are applied, Equation 3 is obtained.

$$f = m\frac{d\dot{x}}{dt} + c\dot{x} + kx - AV_s^2\sin\left(\frac{\pi}{w+s}x\right) \quad \text{[Equation 3]}$$

Furthermore, when the fourth term on the right side of Equation 3 is Taylor-expanded, and, for example, the fourth and subsequent terms are omitted, Equation 3 can be approximated as Equation 4.

$$f = m\frac{d\dot{x}}{dt} + c\dot{x} + \left(k - \frac{\pi}{w+s}AV_s^2\right)x + \frac{\pi}{6(w+s)}AV_s^2 x^3 \quad \text{[Equation 4]}$$

In Equation 4, the third term on the right side is a term of a force that linearly acts on the displacement x of the movable electrode 12. The coefficient is smaller than the spring constant k. That is, the braking force acting linearly is reduced as compared with a mode in which the movable electrode 12 vibrates by the action of only the spring structure 13. On the other hand, in Equation 4, the fourth term on the right side is a term of a force nonlinearly acting on the displacement x of the movable electrode 12.

Next, with reference to FIG. 6, the effects of adopting the semiconductor device 100 in the present embodiment will be described.

Figure 6:
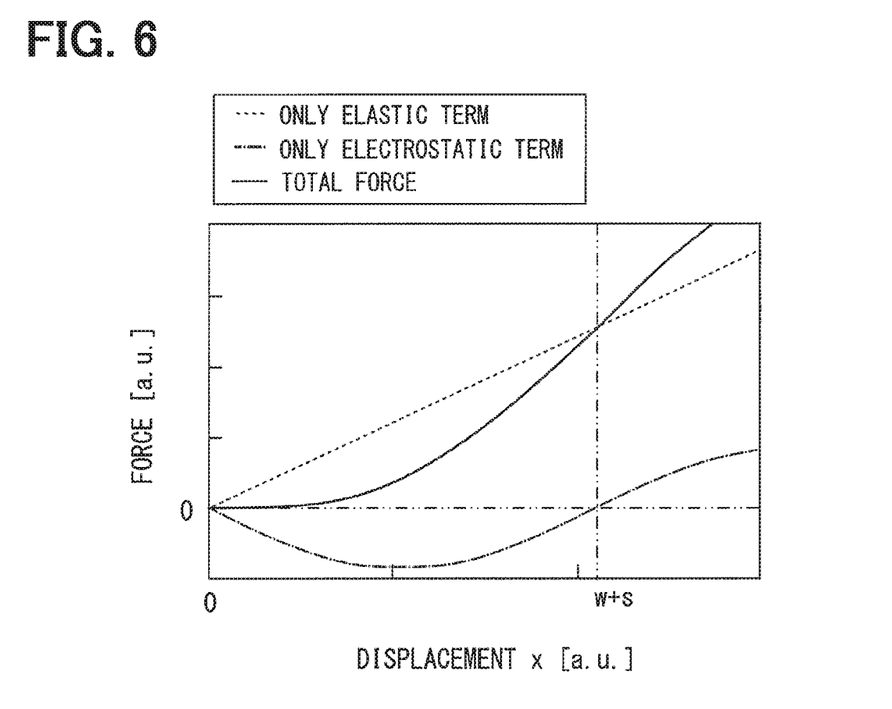
FIG. 6 is a diagram showing a relationship between the displacement of the movable electrode and a force applied to the movable electrode.

FIG. 6 particularly shows the elastic term (i.e., the third term of Equation 3) and the electrostatic term (i.e., the fourth term of Equation 3) which contribute to the restoration of the movable electrode 12 with respect to the displacement x.

Only with the elastic term, as shown by the broken line in FIG. 6, the restoring force is linearly generated as the displacement x increases with the spring constant k as a proportionality constant.

When the restoring force by the electrostatic term is added to the elastic term, as shown by the solid line in FIG. 6, the restoring force is smaller than the restoring force only with the elastic term up to the predetermined displacement amount. Then, when the displacement amount of the movable electrode 12 is larger than the predetermined displacement amount, a larger restoring force than the restoring force only with the elastic term acts. Here, the predetermined displacement amount corresponds to w+s.

That is, in the range of 0≤x≤w+s, the movable electrode 12 in the present embodiment exhibits restoring force weaker than the braking force caused by the spring structure 13 alone (hereinafter referred to as soft spring effect). On the other hand, in the range of x>w+s, the movable electrode 12 exhibits restoring force stronger than the braking force caused by the spring structure 13 alone (hereinafter referred to as hard spring effect).

The soft spring effect is due to the fact that the linear coefficient for the displacement x is smaller than the spring constant k in the third term shown in Equation 4. The hard spring effect is due to the fact that the contribution of the nonlinear term to the displacement x increases in the fourth term in Equation 4.

In the semiconductor device 100 according to the present embodiment, w+s is smaller than l which is the maximum compression amount of the spring structure 13. Therefore, before the spring structure 13 reaches the maximally compressed state, the hard spring effect is exerted. Therefore, without providing conventional contact type braking device such as a stopper, non-contact braking of the movable electrode 12 can be achieved.

When the displacement is in the range of 0≤x≤w+s, the restoring force is smaller than in the case only with the spring structure 13. Therefore, the movable electrode 12 can be more easily vibrated even with smaller vibration. That is, the responsiveness of power generation can be improved.

Note that, unlike the present embodiment, suppose that the movable electrode 12 and the fixed electrode 11 overlap with each other in a state where the movable electrode 12 rests. In this case, Φ=0, and the sign (e.g., plus or minus) of the fourth term in Equation 3 is reversed. In this case, the linear coefficient for the displacement x is larger than the spring constant k, and the hard spring effect occurs in the range of displacement 0≤x≤w+s. Furthermore, the soft spring effect occurs in the range of displacement x>w+s. That is, the movement of the movable electrode 12 is inhibited in the range of 0≤x≤w+s. Furthermore, the braking force is weakened in the range of x>w+s.

Accordingly, in the state where the movable electrode 12 rests, as the electrode 12a is arranged closer to the center of the adjacent electrodes 11a, the soft spring effect in the range of 0≤x≤w+s and the hard spring effect in the range of x>w+s can be obtained. This effect is most effective when the movable electrode 12 rests and the electrode 12a is located just in the center of the adjacent electrodes 11a. That is, the movable electrode 12 is shifted from the fixed electrode 11 by a half of the formation period in the elastic direction.

In addition, in the present embodiment, the movable electrode 12 and the spring structure 13 are integrally provided and are made of the same conductive material (for example, silicon). In this case, connection reliability can be improved as compared with the case where a separate wiring for electrical connection is formed on the spring structure. Since the spring structure is almost always extended and contracted, it is not preferable to form the connecting wire on the side face of the spring structure or the like. On the other hand, since the spring structure 13 itself is electrically connected to the movable electrode 12 in the present embodiment, the connection reliability can be improved.

Modifications

In the first embodiment, the movable electrode 12 is connected to the frame portion 14 via the spring structure 13, and the frame portion 14 is connected to the load 200. As a result, electrical connection between the movable electrode 12 and the load 200 is secured.

Since the frame portion 14 is conductive, parasitic capacitance is generated between the frame portion 14 and the conductive substrate 10 via the insulation film 15. That is, the electric charge generated by the displacement of the movable electrode 12 due to the vibrations may flow out to the parasitic capacitance and the responsiveness to power generation may decrease.

Figure 7:
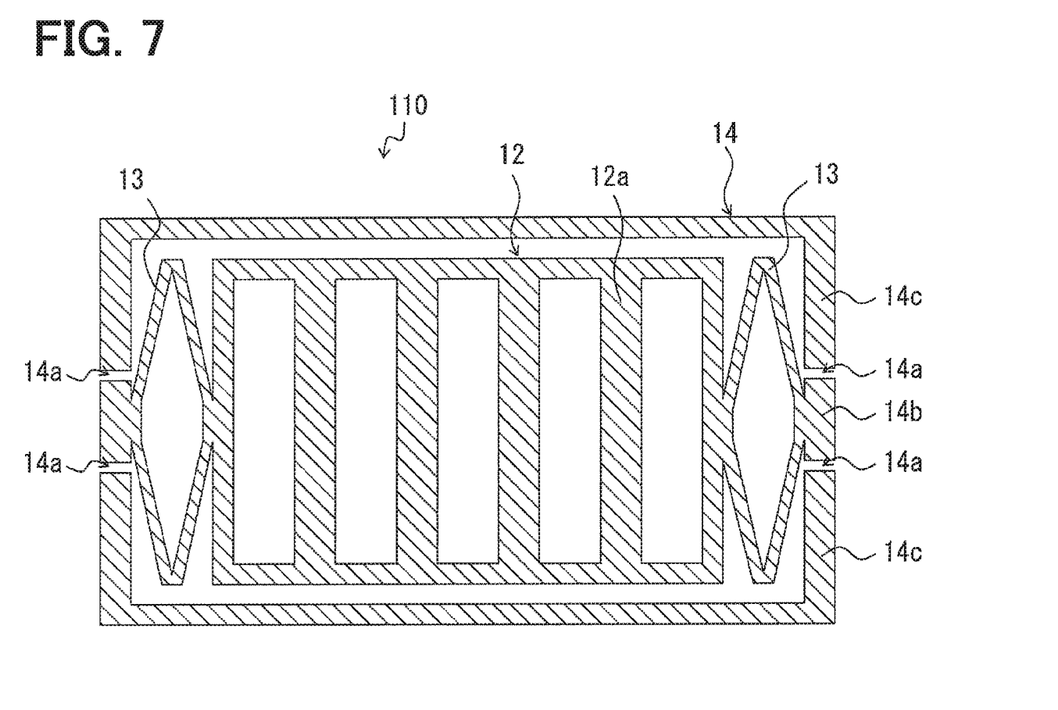
FIG. 7 is a top view showing a structure of a movable electrode in a modified example.

On the other hand, as shown in FIG. 7, in the semiconductor device 110 of this modification, the frame portion 14 has a slit 14a diving the frame portion 14 into a first frame portion 14b and a second frame portion 14c. The slit 14a may be referred to as a trench 14a. Specifically, the frame portion 14 is divided by the slit 14a into the first frame portion 14b electrically connected to the spring structure 13 and the second frame portion 14c other than the first frame portion 14 b. The slit 14a penetrates the frame portion 14 and reaches the insulation film 15. The slit 14a electrically separates the first frame portion 14b and the second frame portion 14c. In particular, the slit 14a is formed in the vicinity of the connection portion between the spring structure 13 and the frame portion 14. The area of the first frame portion 14b is less than the area of the second frame portion 14c in the front view of main surface 11b of the fixed electrode 11.

In this case, the region of the frame portion 14 where the parasitic capacitance may be generated is a relatively small area provided by the first frame portion 14b. Therefore, as compared with the semiconductor device 100 of the first embodiment in which the slit 14a is not formed, parasitic capacitance can be reduced. That is, responsiveness to the power generation can be improved.

Second Embodiment

In the above-described first embodiment, the fixed electrode 11 is made of electret. However, the electret may be adopted on the movable electrode 12.

Figure 8:
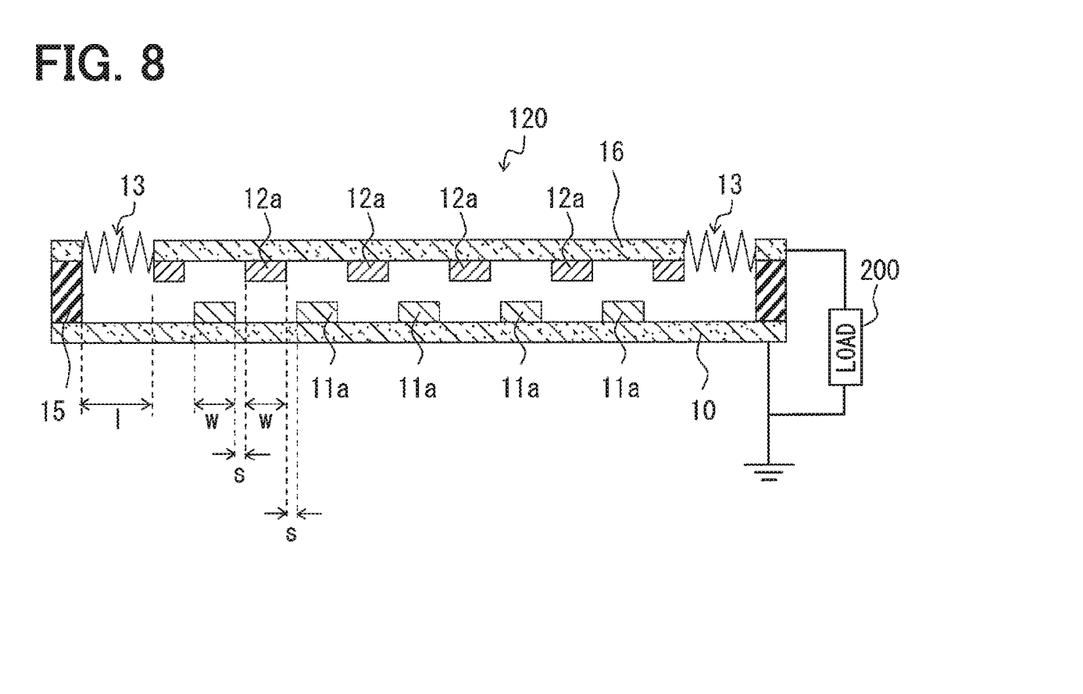
FIG. 8 is a cross-sectional view showing a structure of a movable electrode and a fixed electrode in a second embodiment.

As shown in FIG. 8, in the semiconductor device 120, the electrode 11a included in the fixed electrode 11 is made of, for example, silicon, and is formed on the conductive substrate 10 containing, for example, silicon as a main component. On the other hand, the movable electrode 12 facing the fixed electrode 11 includes an electrode 12a made of electret. The electrode 12a included in the movable electrode 12 is formed on, for example, a conductive substrate 16 containing silicon as a main component.

That is, the movable electrode 12 includes the conductive substrate 16 and the electrode 12a made of electret joined with each other and movable integrally. Charges are generated at the interface between the electrode 12a and the conductive substrate 16 by a charging means such as corona discharge, and permanent electric polarization occurs.

Also in the present embodiment, the electrode 11a included in the fixed electrode 11 and the electrode 12a included in the movable electrode 12 are formed in a stripe shape, and the width and the formation period thereof are the same as those in the first embodiment. The relative positional relationship and displacement between the movable electrode 12 and the fixed electrode 11 are the same as those in the first embodiment. When the movable electrode 12 rests and the electrode 12a is located just in the center of the adjacent electrodes 11a, the soft spring effect in the range of 0≤x≤w+s and the hard spring effect in the range of x>w+s are achieved.

Other Embodiments

While preferred embodiments of the present disclosure have been described above, the present disclosure is not limited in any way by the embodiments described above, and may be carried out with various modifications without departing from the scope of the subject matter of the present disclosure.

In each of the embodiments described above, the electrode 11a included in the fixed electrode 11 is formed in a stripe shape and the electrode 12a included in the movable electrode 12 is formed in a stripe shape. However, the shape of each electrode 11a and 12a is not limited to a stripe shape.

Figure 9:
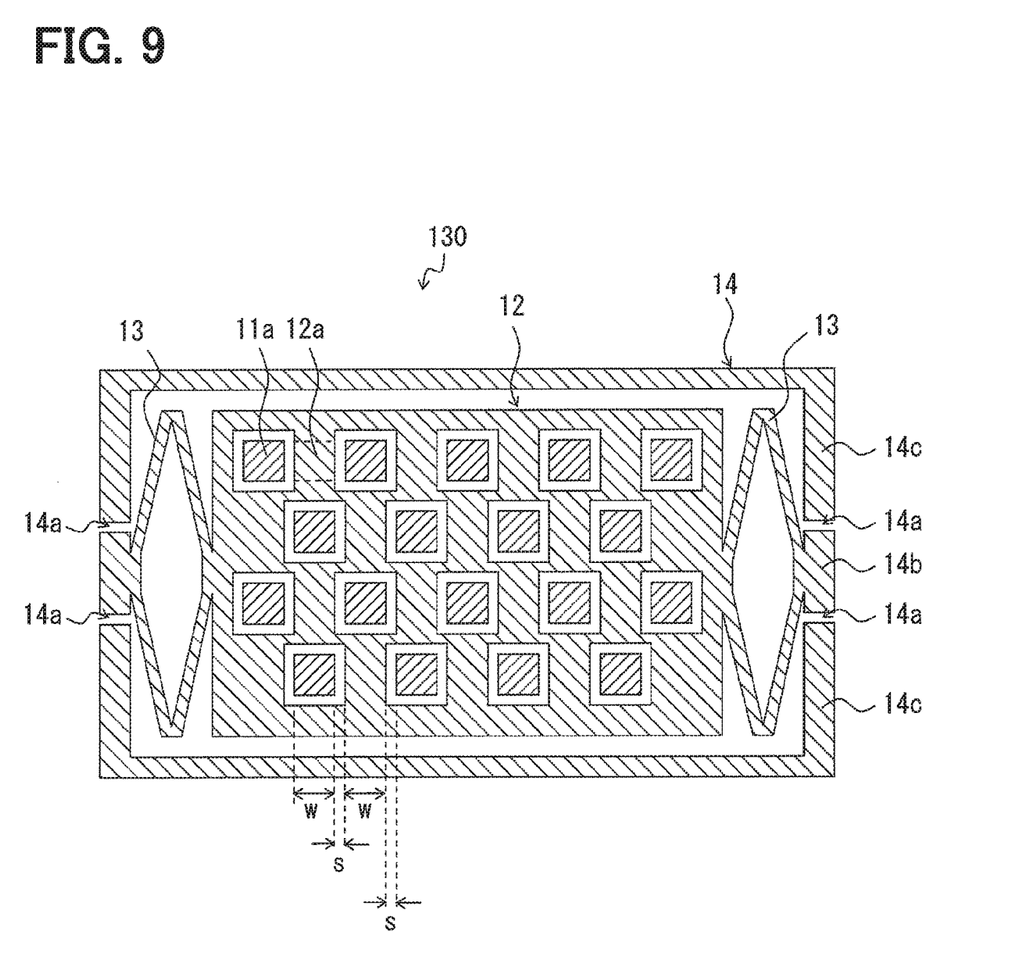
FIG. 9 is a top view showing structures of a movable electrode and a fixed electrode in other embodiments.

For example, in the semiconductor device 130 shown in FIG. 9, the movable electrode 12 has a substantially checkered grid structure with a cut-out portion and a remaining portion. In the front view of one surface 11b of the fixed electrode 11, the electrode 11a included in the fixed electrode 11 is formed in a substantially checkered pattern. The electrode 11a can be seen from the cut-out portion of the movable electrode 12 in a state where the movable electrode 12 rests.

Also in this embodiment, the formation period of the electrode 11a is 2w+2s, and the formation period of the electrode 12a is also 2w+2s in the movable direction of the movable electrode 12, that is, in the elastic direction of the spring structure 13. In the state where the movable electrode 12 rests, the electrode 12a is located just in the center of the adjacent electrodes 11a, and l>w+s is satisfied, the soft spring effect in the range of 0≤x≤w+s and the hard spring effect in the range of x>w+s are achieved.

In each of the embodiments described above, silicon is exemplified as a constituent material of the electrode facing the electret. However, the constituent material is not limited as long as functioning as an electrode. For example, copper, aluminum, or gold may be adopted. Although silicon is exemplified as a constituent material of the conductive substrates 10 and 16 on which the electrodes are arranged, the constituent material may not be limited to silicon. However, for the conductive substrate to be bonded with the electret, it is preferable to select a material capable of easily holding charges at the interface with the electret.

Although the present disclosure is described based on the above embodiments, the present disclosure is not limited to the embodiments and the structures. Various changes and modification may be made in the present disclosure. Furthermore, various combinations and formations, and other combinations and formations including one or more than one or less than one element may be included in the scope and the spirit of the present disclosure.

Optional aspects of the present disclosure will be set forth in the following clauses.

According to an aspect of the present disclosure, a semiconductor device includes a fixed electrode, a movable electrode and an elastic support. The movable electrode faces a main surface of the fixed electrode and is movable relative to the fixed electrode along the main surface. The elastic support supports the movable electrode to be movable in an elastic direction of the elastic support.

Either one of the fixed electrode or the movable electrode is an electret electrode. Each of the fixed electrode and the movable electrode includes electrode parts periodically provided in the elastic direction. A formation period of the electrode parts included in each of the fixed electrode and the movable electrode is less than twice a movable distance of the movable electrode from a resting state where the movable electrode rests to a compressed state where the elastic support is maximally compressed.

The movable electrode does not overlap the fixed electrode in a front view of the main surface of the fixed electrode when the movable electrode is in the resting state. The movable electrode is configured to overlap the fixed electrode when the movable electrode vibrates.

According to the aspect of the present disclosure, when the movable electrode is displaced by more than a half of the formation period, a dynamic force nonlinear to the displacement and caused by electrostatic capacitance between the movable electrode and the fixed electrode is added to a braking force linear to the displacement and cased by the spring constant of the elastic support. That is, when the movable electrode is displaced by more than a half of the formation period, a restoring force greater than the restoring force caused only by the elastic support is generated.

Therefore, the movement of the movable electrode can be limited without providing a conventional stopper, and breakage of the movable electrode or the movable body holding the movable electrode due to collision with the stopper may not occur. That is, braking of the movable portion can be achieved while suppressing damage due to collision.

What is claimed is:

1. A semiconductor device comprising:
   a fixed electrode;
   a movable electrode facing a main surface of the fixed electrode and being movable relative to the fixed electrode along the main surface; and
   a pair of elastic supports supporting the movable electrode from both sides in an elastic direction of the pair of elastic supports to be movable in the elastic direction, wherein
   either one of the fixed electrode or the movable electrode is an electret electrode,
   each of the fixed electrode and the movable electrode includes electrode parts periodically provided in the elastic direction,
   a formation period of the electrode parts included in each of the fixed electrode and the movable electrode is less than twice a movable distance of the movable electrode from a resting state where the movable electrode rests to a compressed state where one of the pair of elastic supports is maximally compressed,
   the movable electrode does not overlap the fixed electrode in a front view of the main surface of the fixed electrode when the movable electrode is in the resting state, and
   the movable electrode is configured to overlap the fixed electrode when the movable electrode vibrates wherein the fixed electrode is formed on a semiconductor substrate, and the movable electrode directly faces the semiconductor substrate without an intervening layer when the movable electrode is in the resting state.

2. The semiconductor device according to claim 1, wherein
   the electrode parts of the movable electrode are shifted respectively from the electrode parts of the fixed electrode by a half of the formation period in the elastic direction.

3. The semiconductor device according to claim 1, wherein
   the movable electrode and the elastic support are provided integrally and made of a same conductive material.

4. The semiconductor device according to claim 3, further comprising
a frame connected to the elastic support and supporting the elastic support, wherein
the frame has a trench electrically dividing the frame into a first frame portion and a second frame portion,
the first frame portion is connected to the elastic support, and
the second frame portion is a remaining part of the frame other than the first frame portion.

5. The semiconductor device according to claim 1, wherein
the electrode parts of the fixed electrode extend in a stripe shape in a direction orthogonal to the elastic direction, and
the electrode parts of the movable electrode extend in a stripe shape in the direction orthogonal to the elastic direction.

6. The semiconductor device according to claim 1, wherein
the resting state is a state where no external force is applied to the semiconductor device.

7. The semiconductor device according to claim 1, wherein
the electrode parts included in the fixed electrode are fixed electrode parts,
the electrode parts included in the movable electrode are movable electrode parts, and
when each of the fixed electrode parts and the movable electrode parts has a width of "w", one of the fixed electrode parts is at a distance of "s" from adjacent one of the movable electrode parts in the elastic direction in the resting state where the movable electrode rests, and each of the pair of elastic supports has a maximum compression amount of "1," a relationship of w+s<1 is satisfied.

8. The semiconductor device according to claim 1, wherein
the pair of elastic supports includes a pair of spring elements located on opposite sides of the moveable electrode, respectively,
a braking force is provided by the spring portions to the moveable electrode in a linear direction with respect to a displacement of the moveable electrode when the moveable electrode vibrates,
the braking force is determined based on spring constants of the spring portions,
a dynamic force nonlinear to the displacement of the moveable electrode is added to the braking force when the moveable electrode is displaced by more than a half of the formation period, and
the dynamic force is caused by an electrostatic capacitance between the moveable electrode and the fixed electrode.

* * * * *

UNITED STATES PATENT AND TRADEMARK OFFICE
CERTIFICATE OF CORRECTION

PATENT NO. : 10,666,166 B2
APPLICATION NO. : 16/263227
DATED : May 26, 2020
INVENTOR(S) : Goda et al.

It is certified that error appears in the above-identified patent and that said Letters Patent is hereby corrected as shown below:

On the Title Page

Item (73)
Assignees should read:
-- DENSO CORPORATION, Kariya-city, Japan;
University of Freiburg, Freiburg, Germany --

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*